(12) United States Patent
Park et al.

(10) Patent No.: US 7,833,908 B2
(45) Date of Patent: Nov. 16, 2010

(54) SLURRY COMPOSITION FOR CHEMICAL-MECHANICAL POLISHING CAPABLE OF COMPENSATING NANOTOPOGRAPHY EFFECT AND METHOD FOR PLANARIZING SURFACE OF SEMICONDUCTOR DEVICE USING THE SAME

(75) Inventors: Jea Gun Park, Seongnam (KR); Takeo Katoh, Seoul (KR); Won Mo Lee, Seoul (KR); Hyun Goo Kang, Busan (KR); Sung Jun Kim, Gwangju (KR); Un Gyu Paik, Seoul (KR)

(73) Assignees: Sumco Corporation, Tokyo (JP); Hanyang Hak Won Co., Seoul (KR)

( * ) Notice: Subject to any disclaimer, the term of this patent is extended or adjusted under 35 U.S.C. 154(b) by 67 days.

(21) Appl. No.: 10/556,377

(22) PCT Filed: May 11, 2004

(86) PCT No.: PCT/JP2004/006595

§ 371 (c)(1),
(2), (4) Date: Dec. 6, 2006

(87) PCT Pub. No.: WO2004/100243

PCT Pub. Date: Nov. 18, 2004

(65) Prior Publication Data

US 2007/0158309 A1    Jul. 12, 2007

(30) Foreign Application Priority Data

May 12, 2003    (KR) .................. 10-2003-0029678

(51) Int. Cl.
*H01L 21/302* (2006.01)

(52) U.S. Cl. .................. 438/693; 438/692; 216/91

(58) Field of Classification Search .................. 438/691, 438/692, 693, 694, 700; 216/89.6, 90, 91; 252/79.1
See application file for complete search history.

(56) References Cited

U.S. PATENT DOCUMENTS 6,436,835 B1 *    8/2002    Kido et al. .................. 438/693

(Continued)

FOREIGN PATENT DOCUMENTS

JP    2000-243733 A    9/2000

(Continued)

OTHER PUBLICATIONS

Form PCT/IB/306, for PCT/JP2004/00659.

(Continued)

*Primary Examiner*—Lan Vinh
(74) *Attorney, Agent, or Firm*—Pillsbury Winthrop Shaw Pittman, LLP

(57) ABSTRACT

A slurry composition for chemical-mechanical polishing capable of compensating nanotopography effect present on the surface of a wafer, and a method for planarizing the surface of a semiconductor device that utilizes the same are disclosed. The slurry composition of the present invention is aimed at compensating the nanotopography effect during chemical mechanical polishing process of the oxide layer formed on the surface of the wafer, and contains abrasive particles and an additive, wherein the size of the abrasive particles and the concentration of the additive are controlled within predetermined ranges in order to control the deviation of thickness (OTD) of the oxide layer below a certain level after the chemical mechanical polishing process.

3 Claims, 9 Drawing Sheets

U.S. PATENT DOCUMENTS

| | | | |
|---|---|---|---|
| 6,537,914 B1 | 3/2003 | Park et al. | |
| 6,786,964 B2 * | 9/2004 | Onishi et al. | 106/287.17 |
| 6,875,701 B2 * | 4/2005 | Yanagisawa et al. | 438/714 |
| 6,964,923 B1 * | 11/2005 | Ronay | 438/689 |
| 7,029,509 B2 * | 4/2006 | Kim et al. | 438/692 |
| 2001/0013507 A1 * | 8/2001 | Hosali et al. | 216/89 |
| 2002/0151252 A1 * | 10/2002 | Kawase et al. | 451/36 |
| 2003/0124959 A1 * | 7/2003 | Schroeder et al. | 451/41 |

FOREIGN PATENT DOCUMENTS

| | | |
|---|---|---|
| JP | 2001-7195 | 1/2001 |
| JP | 2003-059868 | 2/2003 |

OTHER PUBLICATIONS

Kim et al., "Influence of the electrokinetic behaviors of abrasive ceria particles and the deposited plasma-enhanced tetraethylorthosilicate and chemically vapor deposited $Si_3N_4$ films in an aqueous medium on chemical mechanical planarization for shallow trench isolation", J. Mater. Res., vol. 18, No. 9, pp. 2163-2169, Sep. 2003.

Japanese Office Action dated Dec. 9, 2008 for Appln. No. 2005-506057.

Notice of Reasons for Rejection for Japanese Application No. 2005-506057 dated Aug. 4, 2009.

* cited by examiner

SLURRY COMPOSITION FOR CHEMICAL-MECHANICAL POLISHING CAPABLE OF COMPENSATING NANOTOPOGRAPHY EFFECT AND METHOD FOR PLANARIZING SURFACE OF SEMICONDUCTOR DEVICE USING THE SAME

CROSS REFERENCE TO RELATED APPLICATIONS

This is the U.S. National Phase of PCT/JP2004/006595, filed May 11, 2004, which relies for priority on Korean Patent Application No. 10-2003-0029678, filed on May 12, 2003, both of which are incorporated herein in their entirety by reference.

TECHNICAL FIELD

The present invention relates to a slurry composition for chemical-mechanical polishing and, more particularly, to a slurry composition capable of compensating the effect of nanotopography of the surface of a wafer, and a method for planarizing the surface of a semiconductor device by utilizing the same.

BACKGROUND ART

Chemical mechanical polishing (CMP) is a field of semiconductor processing technology where mechanical processing operation by means of an abrasive agent interposed between a wafer and a polishing pad under pressure and chemical etching operation by the chemical action of slurry are carried out at the same time, and constitutes an essential process of global planarization technology in the manufacture of semiconductor chips of sub-micrometer scale.

FIG. 1 through FIG. 3 are sectional views of process explanatory of a method for planarizing the surface of a common semiconductor device by chemical mechanical polishing, exemplifying STI (shallow trench isolation) process.

With reference made to FIG. 1, after forming a pad oxide layer (12) made of silicon oxide ($SiO_2$) and a nitride layer (14) made of silicon nitride ($Si_3N_4$) on a substrate (10) made of single crystal of silicon, a photoresist pattern (not shown) that delimits a trench region (16) for electrically isolating active regions of device is formed, and the nitride layer (14) is etched by using the photoresist as an etching mask, which is used as an etching mask to form the trench region (16) by etching the pad oxide layer (12) and the substrate (10) to a predetermined depth. Then the trench region (16) is filled and an oxide layer (18a) made of silicon oxide is formed by vapor deposition so as to have a certain height above the surface of the nitride layer (14).

Now referring to FIG. 2, a primary chemical mechanical polishing process is carried out on the oxide layer (18a) by using a silica slurry composition. The reason why a silica-based slurry is used is that a polishing agent based on silica slurry is constituted from particles generally smaller than those of a polishing agent based on ceria slurry, and has higher efficiency of polishing the oxide layer (18a) that includes surface irregularities.

Now referring to FIG. 3, a secondary chemical mechanical polishing process is carried out on the oxide layer (18b) that remains on the nitride layer (14) in FIG. 2, until the surface of the nitride layer (14) is exposed, thereby to achieve global planarization so that oxide layer (18c) fills only the trench region (16).

Meanwhile the surface of the substrate (10) is not smooth over the entire surface of the wafer in the case of the CMP process, thus giving rise to such a problem that sufficient global planarization cannot be achieved in case the density of the trench regions (16) varies across the wafer.

FIG. 4a is a sectional view showing the surface of a semiconductor substrate prior to the CMP process for the explanation of nanotopography, FIG. 4b is a schematic diagram showing the thickness of an oxide layer formed on the semiconductor substrate prior to the CMP process, FIG. 5a is a sectional view showing the surface of the semiconductor substrate of FIG. 4a after the semiconductor substrate has been subjected to the CMP process, and FIG. 5b is a schematic diagram showing the thickness of the oxide layer formed on the semiconductor substrate after the CMP process.

Referring to FIG. 4a, the oxide layer (22) having a predetermined thickness is formed by vapor deposition on the substrate (20) made of single crystal of silicon that constitutes a wafer. FIG. 4a depicts, in significantly exaggerated manner, the so-called nanotopography of the surface of the substrate (20), namely such a profile that is characterized by a wavy surface of certain wavelength and certain deviation in height. Nanotopography is generally defined by a wavelength (L) ranging from 0.2 to 20 mm and deviation in height (H) from 20 to 80 mm. The oxide layer (22) formed on the substrate (20) by vapor deposition also has a surface profile of wavy pattern having a certain wavelength, formed under the influence of the nanotopography of the surface of the substrate (20).

Even when the oxide layer (22) is formed with certain waviness on the surface under the influence of the nanotopography of the surface of the substrate (20) as shown in FIG. 4b, thickness of the oxide layer (22) formed by vapor deposition becomes constant over the entire surface of the substrate (20).

When the CMP process is applied to the substrate (20) shown in FIG. 4a as a global planarization process, although the surface becomes flat as shown in the sectional view of FIG. 5a, thickness of the oxide layer (22a) extracted from FIG. 5a shows significant deviation across the surface as shown in FIG. 5b. That is, since the substrate surface that makes contact with a polishing pad of the polishing apparatus is polished at a constant rate over the entire wafer, the oxide layer (22a) is under-polished and becomes thicker at a point located above a valley region of the substrate (20) surface as indicated by "A", and is over-polished and becomes thinner at a point located above a peak region of the substrate (20) surface as indicated by "B". "Y3" in the diagram indicates mean thickness of the oxide layer (22a) after polishing.

As a result, the CMP process carried out as the global planarization does not make the thickness of the oxide layer (22a) uniform, because of the nanotopography effect imposed by the surface of the substrate (20). Such a fact presents the following problems, when a constant thickness of a layer over the entire surface of the substrate (20) is required to be maintained. For example, in DRAM as a semiconductor memory device, in the case in which an oxide layer as a gate insulation film of an MOS transistor doesn't have a constant thickness across the entire wafer, the reliability of the device can be adversely affected by, for example, a malfunction of the semiconductor device due to a deviation in the voltage input to the MOS transistors.

In the case of a semiconductor substrate (10) where the trench region (16) shown in FIG. 3 is formed, too, if a portion where the trench region (16) is formed is located in the valley region of nanotopography, the portion is under-polished and the oxide layer (18c) remains on the nitride layer (14), too. In case the portion is located in the peak region, on the other hand, the portion is over-polished and the corresponding portion of the nitride layer (14) may be removed by polishing, thus resulting in very small margin for the CMP process.

DISCLOSURE OF INVENTION

An object of the present invention is, in order to solve the problems of the prior art described above, to provide a slurry composition for chemical-mechanical polishing that is capable of making maximum compensation for the nanotopography effect of wafer surface.

Another object of the present invention is to provide a method for planarizing the surface of a semiconductor device by using the slurry composition of the present invention.

In order to achieve the objects described above, the slurry composition for chemical-mechanical polishing of the present invention, that is used to compensate the nanotopography effect during chemical mechanical polishing process of an oxide layer formed on the wafer surface, contains abrasive particles and an additive, with the size of the abrasive particles and the concentration of the additive being controlled within predetermined ranges in order to control the deviation of thickness (OTD) of the oxide layer below a certain level after the chemical mechanical polishing process.

It is preferable that the sizes of the abrasive particles are controlled within a range from 2 nm to 1000 nm, and the concentration of the additive is controlled to not higher than 10% by weight.

The method for planarizing the surface of a semiconductor device according to the present invention aimed at achieving another object of the present invention has the steps of: preparing a wafer where nanotopography of certain wavelength and certain height is formed in the surface thereof; forming an oxide layer of a predetermined thickness on the wafer by vapor deposition; and removing the oxide layer so as to planarize the surface by chemical mechanical polishing, wherein such a slurry composition is used in the chemical mechanical polishing process that contains abrasive particles and an additive, with the size of the abrasive particles and the concentration of the additive being controlled within predetermined ranges in order to control the deviation of thickness (OTD) of the oxide layer below a certain level after the chemical mechanical polishing process.

In the step of preparing the wafer, the wafer may be either a bare wafer or a wafer having a nitride layer formed on the surface and trench formed therein.

According to the present invention, by adding the additive with a concentration controlled within a predetermined range, it is made possible to improve the polishing rate selection ratio of the oxide layer to the nitride layer, while controlling the sizes of the abrasive particles within a predetermined range so as to compensate the nanotopography effect present on the surface of the semiconductor wafer and decrease the deviation of thickness of the oxide layer after the CMP process.

BEST MODE FOR CARRYING OUT THE INVENTION

Preferred examples of the present invention will now be described in detail with reference to the accompanying drawings. The examples are not intended to limit the present invention, but are described to merely exemplify the concept of the present invention for easier understanding thereof by those of skills in the art.

The present inventors conducted tests and measurements on the influences of the additive concentration and the size of the abrasive particles, contained in the slurry used in CMP process, on nanotopography effect. For the slurry used in STI (shallow trench isolation) CMP processes represented by the method for planarizing the surface of semiconductor devices, the selection ratio of the rate of removing between the oxide layer and the nitride layer makes a critical factor that determines the margin of the STI process, and finally the yield of production. When compared with a silica slurry widely used in polishing of the oxide layer, ceria slurry has an advantage of higher selection ratio of the rate of removing by polishing.

Accordingly, the present inventors prepared slurry composition for chemical-mechanical polishing having higher selection ratio of rate of removing the oxide layer to that of nitride layer by polishing. With slurries containing high purity abrasive particles made of ceria of three different sizes being prepared, solid displacement reaction method utilizing cerium carbonate as precursor was applied to all slurries. Sizes of the abrasive particles were measured using AcoustoSizer II manufactured by Colloidal Dynamics Inc. The results of measurements are shown in Table 1.

TABLE 1

|  | Slurry type | | |
| --- | --- | --- | --- |
|  | Slurry A | Slurry B | Slurry C |
| Size of abrasive particles (nm) | 148.0 | 81.5 | 71.7 |

The abrasive particles were dispersed in deionized water, to which polyacrylic acid, a commercially available dispersant, was added so as to stabilize the dispersed state of the abrasive particles. This was followed by, for example, addition of 0 to 0.8% by weight of poly-meta-acrylate-acid as anionic organic additive. Such an anionic additive is used to control the selection ratio of oxide layer to nitride layer in the rate of the CMP polish-removing. Last, the solution was diluted with deionized water, thereby to control the concentration (the solid contents) of the abrasive particles made of ceria to 1% by weight. Hydrogen ion exponent of the slurry was controlled to 7.0 by adding an alkaline agent.

Figure 6:
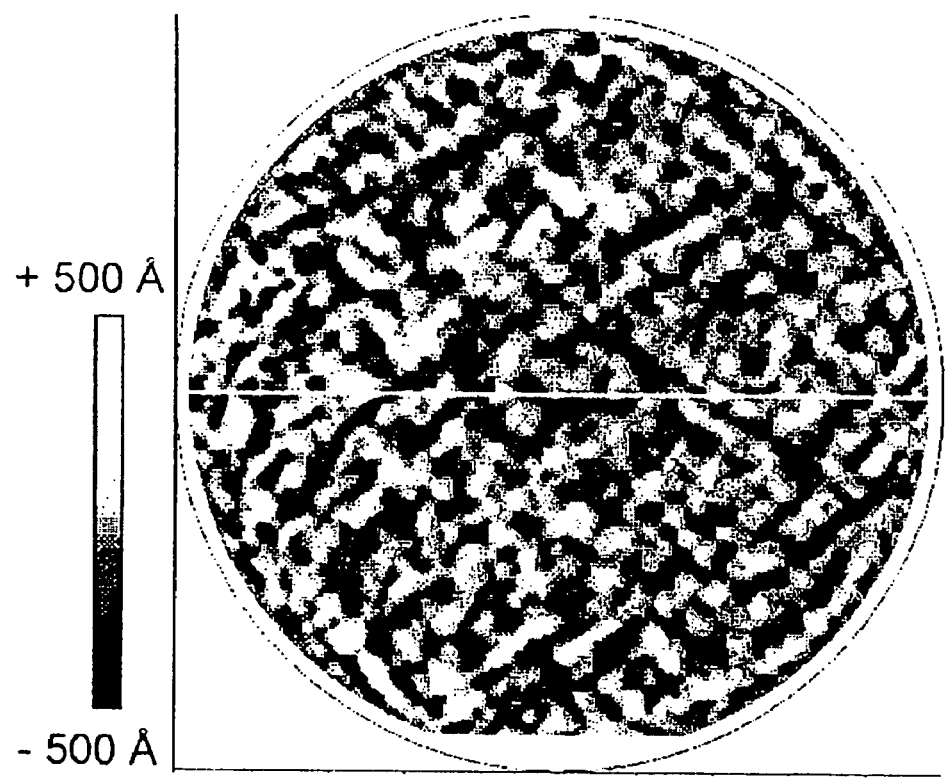
FIG. 6 is a plan view showing the height distribution of nanotopography over the surface of the semiconductor wafer prepared to apply example of the present invention.
Figure 7:
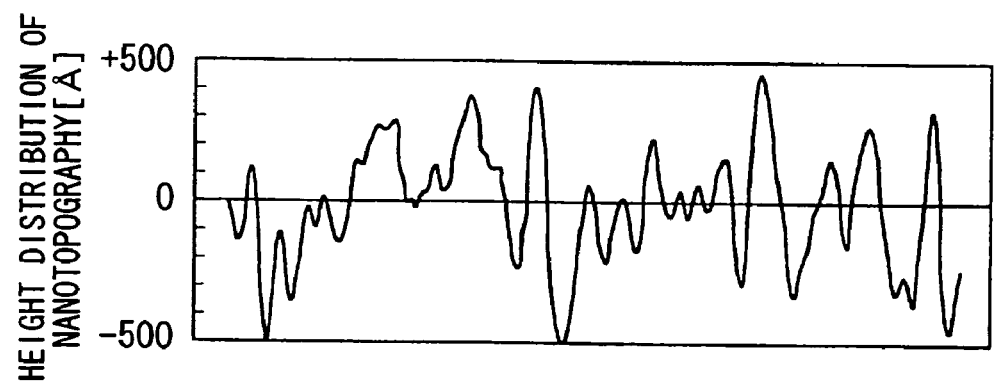
FIG. 7 is a graph showing the height distribution of the nanotopography measured along lateral direction in FIG. 6.

Then a bare silicon wafer measuring 8" in diameter was prepared by one-side polishing method. A PETEOS (plasma enhanced tetra-ethyl-ortho-silicate) film was formed as the oxide layer to a thickness of 7000 Å by chemical vapor deposition method. The height of the nanotopography on the wafer surface was measured with Nano-Mapper manufactured by ADE Inc. The results of measurement are shown in FIG. 6 and FIG. 7. FIG. 6 is a plan view showing the height distribution of the nanotopography of the semiconductor wafer that was prepared. FIG. 7 is a graph showing the height distribution of the nanotopography measured along lateral direction across the center in FIG. 6.

The relatively dark region in FIG. 6 corresponds to a valley region of relatively low height in FIG. 7, and the relatively bright region in FIG. 6 corresponds to a peak region of relatively larger height in FIG. 7.

Then Strasbaugh 6EC having a single polishing pad and a polishing platen was used to polish the oxide layer. IC1000/Suba IV pad manufactured by Rodel Inc. was used with a polishing pressure of 4 psi (pounds per square inch) applied as the down force and back pressure being set to 0. Rotating speeds of the head and the table were set to 70 rpm, and relative speed of the pad and the wafer was set to 250 fpm (feet per minute). With the flow rate of slurry set to 100 $cm^3$/min and the wafer having been conditioned ex situ with a diamond dresser prior to each run of polishing, deviation in thickness of the oxide layer was measured before and after the CMP using Nanospec 180 of Nanometrics Inc. and Spectroscopic Ellipsometer of Sopra Inc.

Figure 8:
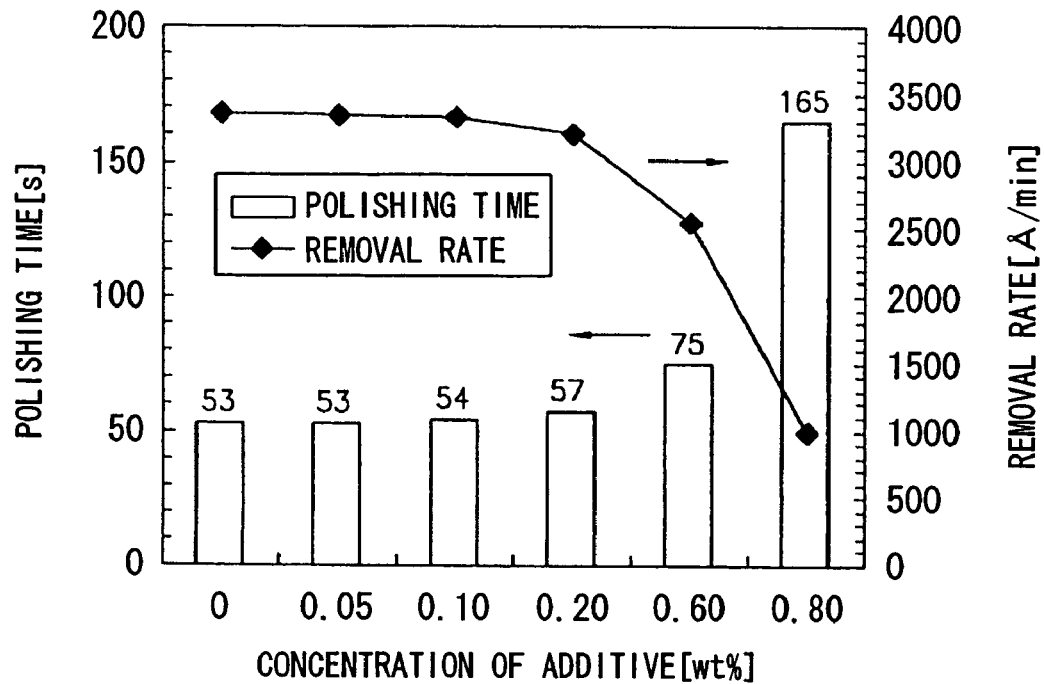
FIG. 8 is a graph showing the changes in the polishing time and removal rate with varying concentration of the additive for the example of the present invention.

Polishing time was controlled so as to achieve a predetermined depth of polishing (3000 Å), in order to eliminate the influence of the depth of polishing on the nanotopography effect. FIG. 8 is a graph showing changes in the duration of polishing (the polishing time) and removal rate with different values of additive concentration for the example of the present invention. It was found from FIG. 8 that the rate of removing by polishing the oxide layer becomes lower as the additive concentration increases, and the duration of polishing was made relatively longer to obtain a constant depth of polishing.

Figure 9A:
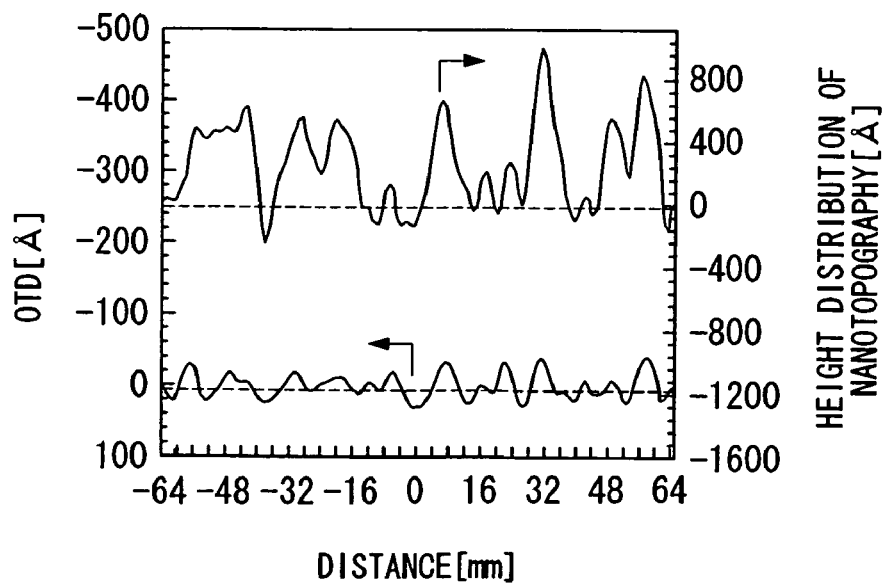
FIG. 9a is a graph showing the height of nanotopography and OTD in the case of slurry A according to the example of the present invention that contains 0% by weight of the additive.
Figure 9B:
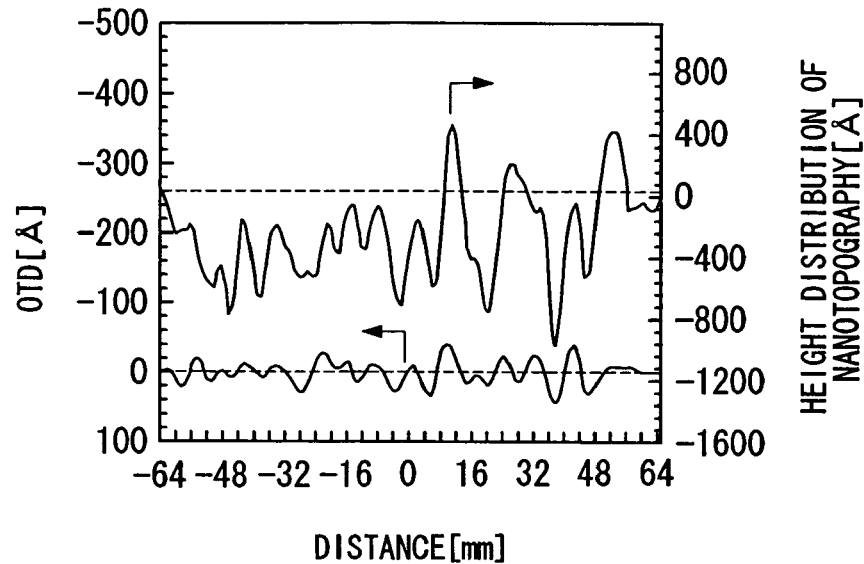
FIG. 9b is a graph showing the height of nanotopography and OTD in the case of slurry A according to the example of the present invention that contains 0.2% by weight of the additive.
Figure 9C:
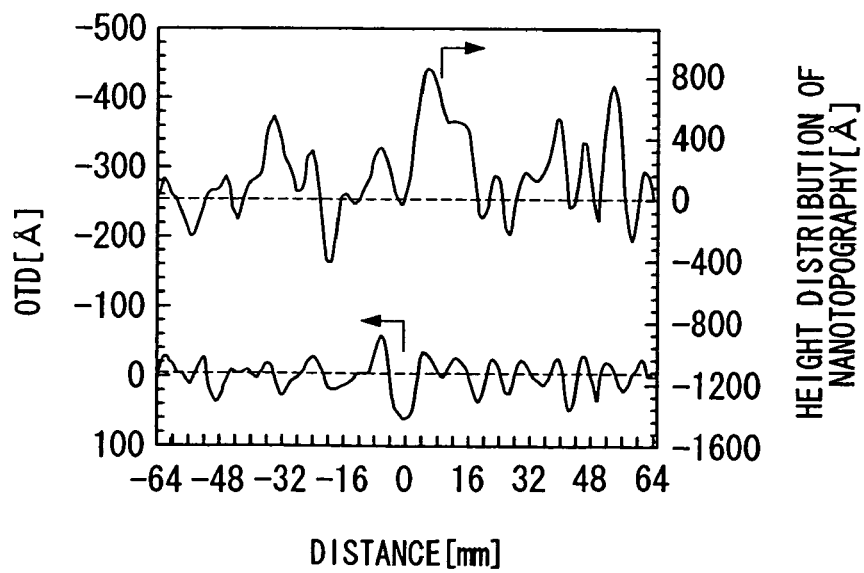
FIG. 9c is a graph showing the height of nanotopography and OTD in the case of slurry A according to the example of the present invention that contains 0.8% by weight of the additive.
Figure 10A:
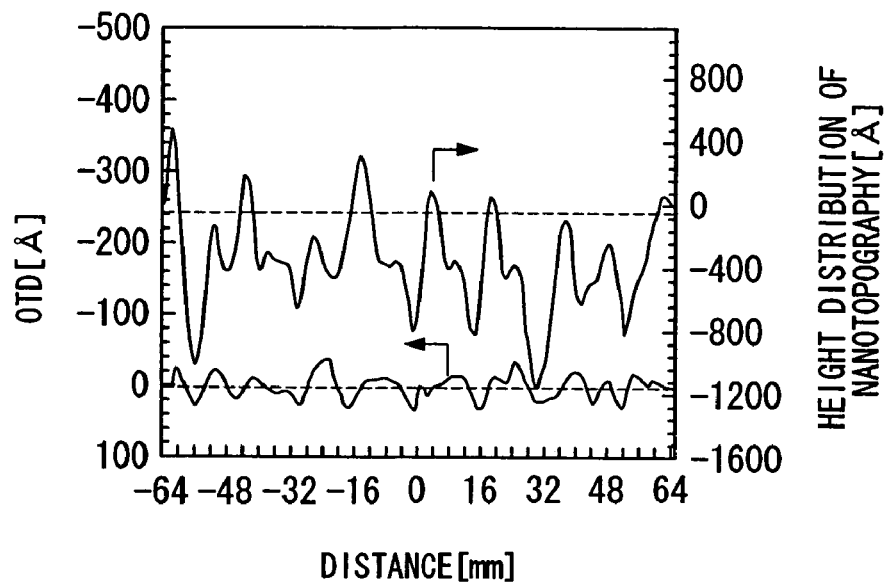
FIG. 10a is a graph showing the height of nanotopography and OTD in the case of slurry B according to the example of the present invention that contains 0% by weight of the additive.
Figure 10B:
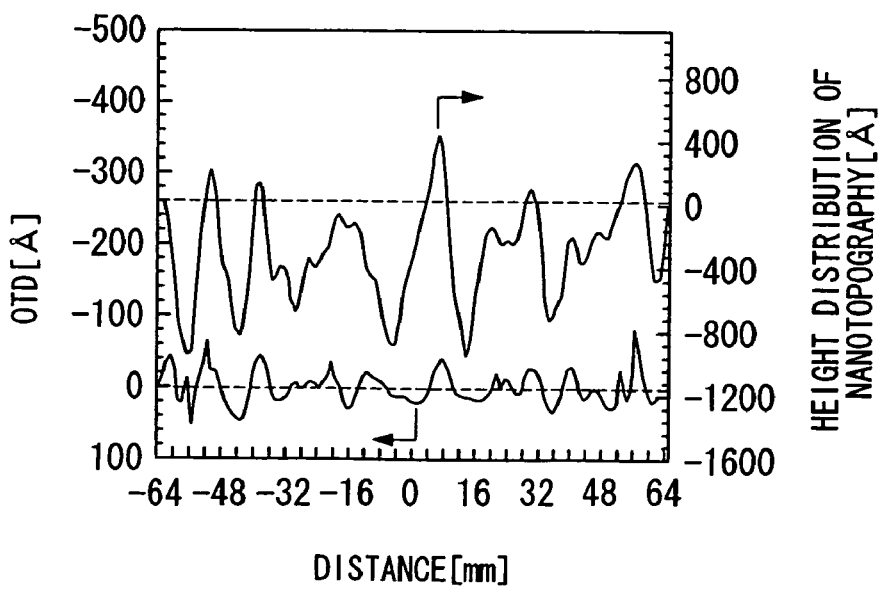
FIG. 10b is a graph showing the height of nanotopography and OTD in the case of slurry B according to the example of the present invention that contains 0.2% by weight of the additive.
Figure 10C:
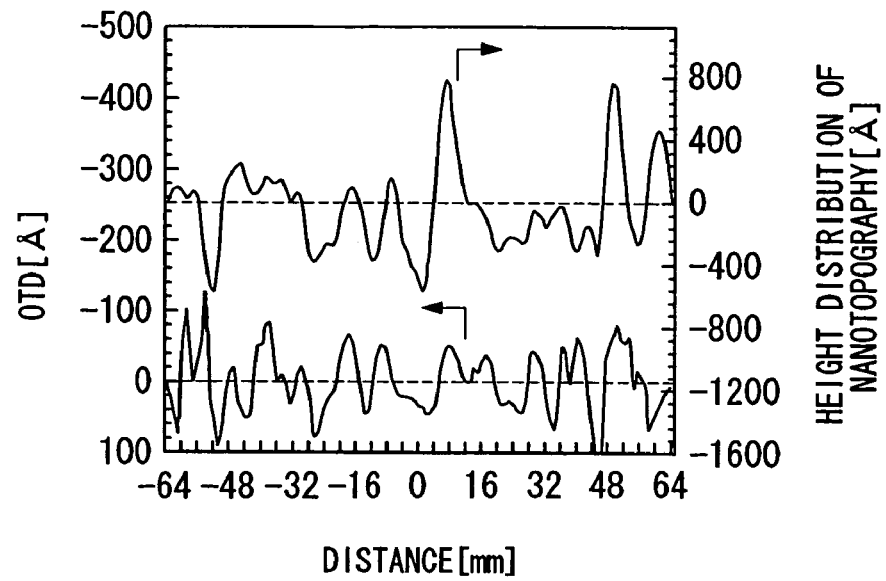
FIG. 10c is a graph showing the height of nanotopography and OTD in the case of slurry B according to the example of the present invention that contains 0.8% by weight of the additive.
Figure 11A:
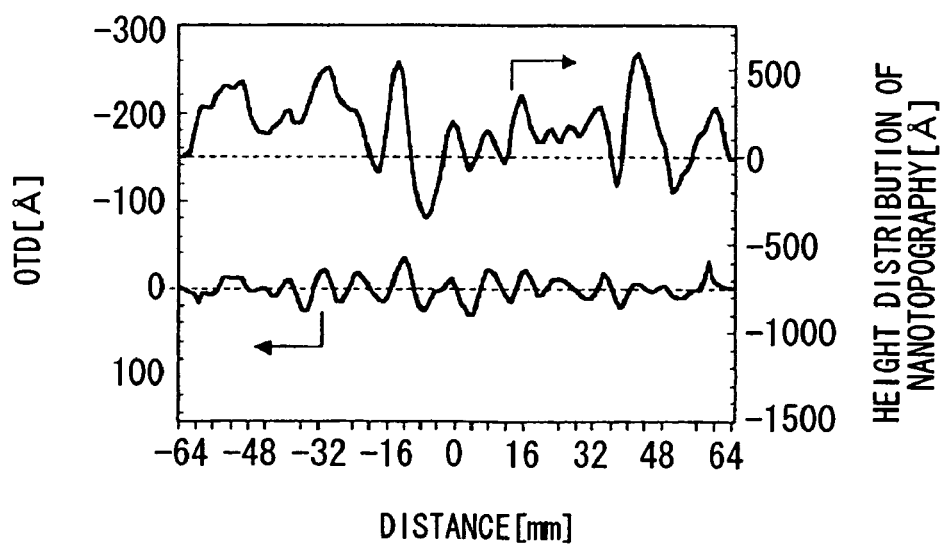
FIG. 11a is a graph showing the height of nanotopography and OTD in the case of slurry C according to the example of the present invention that contains 0% by weight of the additive.
Figure 11B:
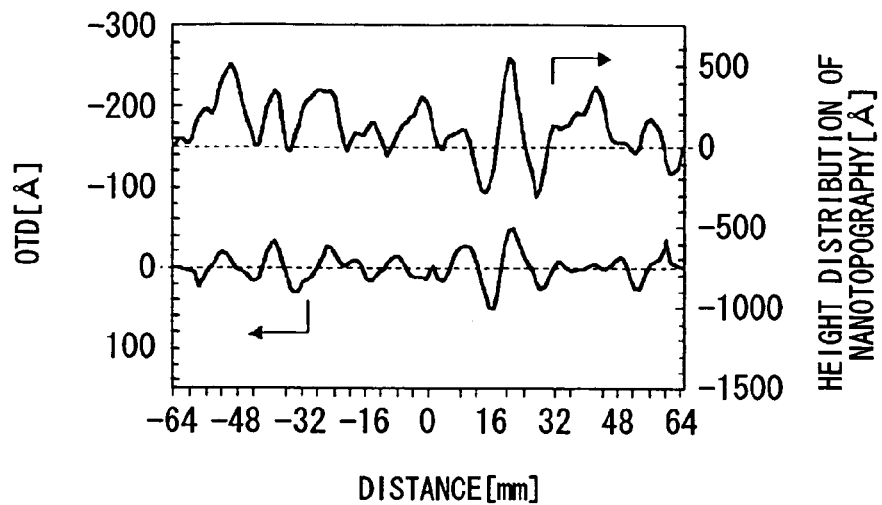
FIG. 11b is a graph showing the height of nanotopography and OTD in the case of slurry C according to the example of the present invention that contains 0.2% by weight of the additive.
Figure 11C:
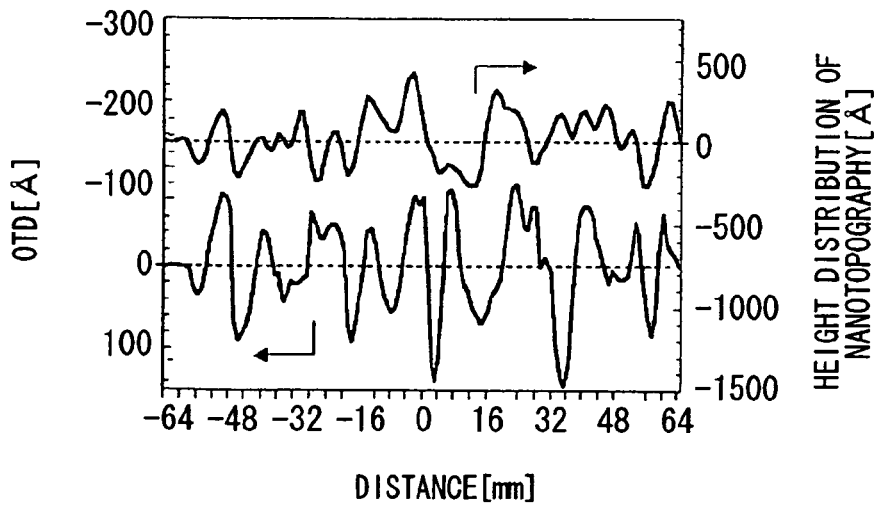
FIG. 11c is a graph showing the height of nanotopography and OTD in the case of slurry C according to the example of the present invention that contains 0.8% by weight of the additive.

FIG. 9a through FIG. 11c are graphs showing the height of nanotopography measured while changing the additive concentration and OTD (oxide thickness deviation) measured after the CMP process, in cases of slurry A, slurry B and slurry C that have different sizes of abrasive particles. FIG. 9a shows the case of slurry A containing 0% by weight of the additive, FIG. 9b shows the case of slurry A containing 0.2% by weight of the additive, and FIG. 9c shows the case of slurry A containing 0.8% by weight of the additive. FIG. 10a shows the case of slurry B containing 0% by weight of the additive, FIG. 10b shows the case of slurry B containing 0.2% by weight of the additive and FIG. 10c shows the case of slurry B containing 0.8% by weight of the additive. FIG. 11a shows the case of slurry C containing 0% by weight of the additive, FIG. 11b shows the case of slurry C containing 0.2% by weight of the additive and FIG. 11c shows the case of slurry C containing 0.8% by weight of the additive.

All the wafers used in the example may show nanotopography properties and sizes very proximate to each other. In order to eliminate the influences of the dimensional factors of the wafer such as warping, raw profile was filtered out by means of a double Gaussian high-pass filter having cutoff length of 20 mm.

All graphs of FIG. 9a through FIG. 11c indicate that height profile of the nanotopography of a wafer and OTD profile change very synchronously. It can also been seen that the OTD size after the CMP process increases as the additive concentration increases, in case the sizes of the abrasive particles are relatively small (slurry C), and that the OTD size after the CMP process is not influenced significantly by the additive concentration in case the sizes of the abrasive particles are relatively large (slurry A).

Thus it is found in this example, that nanotopography effect is all compensated and very uniform and small OTD is obtained despite the changes in the additive concentration when slurry A that has relatively large abrasive particles is used, while in the case of slurry B and slurry C, OTD becomes very large and the nanotopography effect cannot be compensated for when the additive concentration is 0.8% by weight (FIG. 10c, FIG. 11c). Accordingly, it can be seen that the additive concentration and the size of the abrasive particles of the slurry composition of the present invention are very closely related to the compensation of nanotopography effect.

Figure 12:
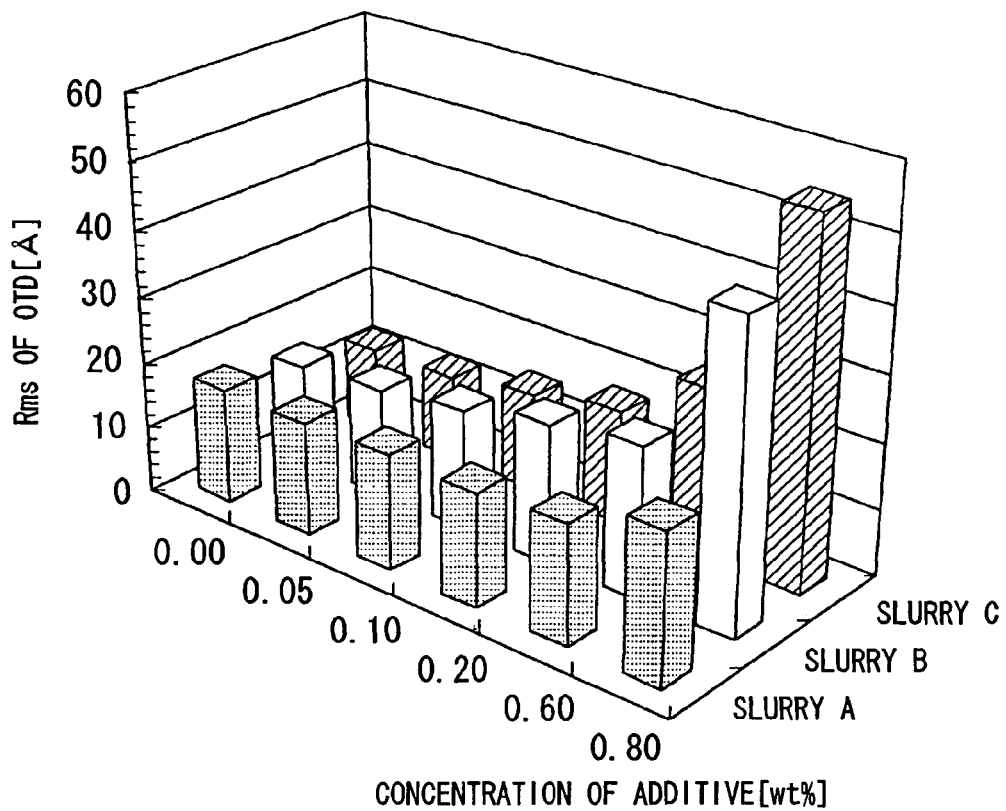
FIG. 12 is a bar graph that compares the Rms values of OTD achieved with the various slurries having different values of additive concentrations according to the example of the present invention.

Then standard deviation (Rms) of OTD with varying concentrations of the additive was determined for each of slurry A, slurry B and slurry C that have different sizes of the abrasive particles, with the results shown in Table 2 and FIG. 12. FIG. 12 is a bar graph that compares the Rms values of OTD achieved with the various slurries having different values of additive concentrations according to the example of the present invention.

TABLE 2

| Slurry | Additive concentration (% by weight) | | | | | |
|---|---|---|---|---|---|---|
| | 0.00 (% by weight) | 0.05 | 0.10 | 0.20 | 0.60 | 0.80 |
| A | 17.4 (Å) | 17.2 | 17.5 | 17.0 | 18.0 | 22.6 |
| B | 16.5 | 21.0 | 15.5 | 22.9 | 18.1 | 46.1 |
| C | 12.7 | 12.9 | 14.7 | 17.1 | 25.3 | 54.7 |

From Table 2 and FIG. 12, it can be seen that standard deviation of OTD receives no significant influence from the additive concentration in the case of slurry A, but is affected somewhat as the additive concentration increases in the case of slurry B, and is influenced greatly as the additive concentration increases in the case of slurry C. Thus it can be seen that the additive concentration has great influence on the nanotopography effect exerted on the OTD after the CMP process when the abrasive particles are small.

Figure 13:
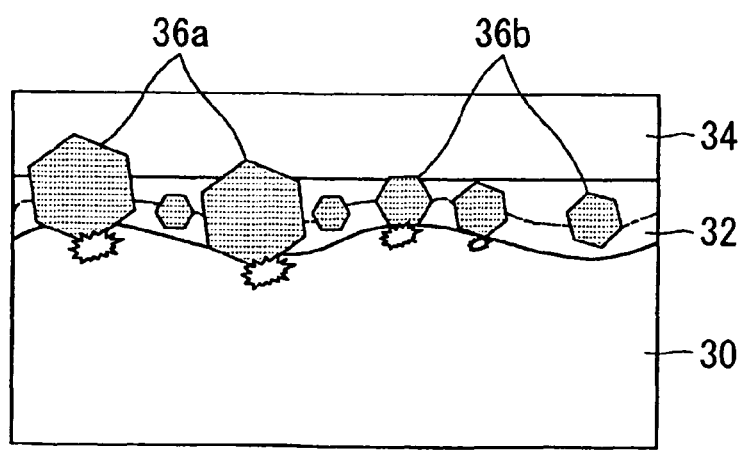
FIG. 13 is a schematic diagram explanatory of the influence of the size of the abrasive particles according to the example of the present invention.

FIG. 13 is a schematic diagram of a model explanatory of the influence of the size of the abrasive particles in the example of the present invention.

FIG. 13 shows that the surface of the oxide layer (30) to be polished in the CMP process has peak regions and valley regions formed thereon at some intervals (certain wavelength) due to the nanotopography effect of the surface of the wafer (not shown) whereon the oxide layer (30) is formed. The polishing process is carried out by supplying the slurry that contains abrasive particles (36a, 36b) to the interface between the oxide layer (30) and the polishing pad (34). Reference numeral 32 denotes an additive protection layer (32) formed from an anionic additive on the surface of the oxide layer (30).

FIG. 13 indicates that, in the case of large abrasive particles (36a), the abrasive particles make direct contact with the surface of the oxide layer (30) not only in the peak regions but also in the valley regions of the oxide layer (30) via the additive protection layer (32), while in the case of small abrasive particles (36b), the abrasive particles (36b) cannot make direct contact with the surface of the oxide layer (30) in the valley regions. As a result, when a slurry that has relatively large abrasive particles is used, polishing operation proceeds satisfactorily throughout the process over the peak regions and the valley regions, so as to maintain very small value of OTD after the CMP process. When a slurry that has relatively small abrasive particles is used, on the other hand, the oxide layer (30) is well polished over the peak regions, although the oxide layer (30) cannot be well polished over the valley regions, thus resulting in very large value of OTD after the CMP process.

While the examples of the present invention have been described in detail, it goes without saying that various variations can be envisaged within the sprit or scope of the appended claims of the present application.

Figure 1:
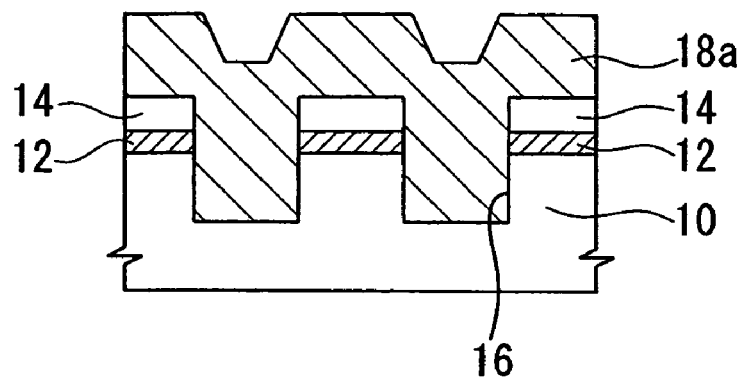
FIG. 1 is a sectional view of process explanatory of a method for planarizing the surface of a common semiconductor device by chemical mechanical polishing (CMP).
Figure 2:
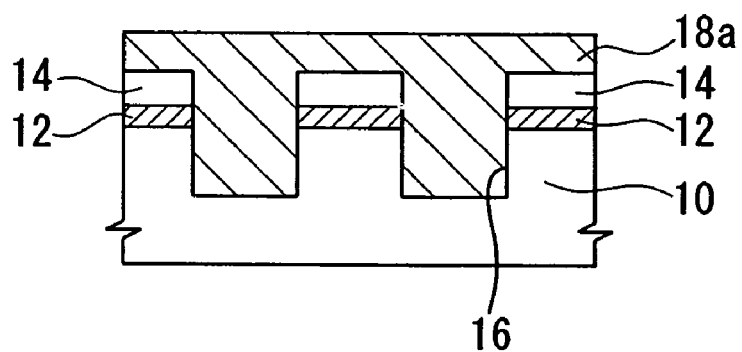
FIG. 2 is a sectional view of process explanatory of the method for planarizing the surface of the common semiconductor device by the chemical mechanical polishing (CMP).
Figure 3:
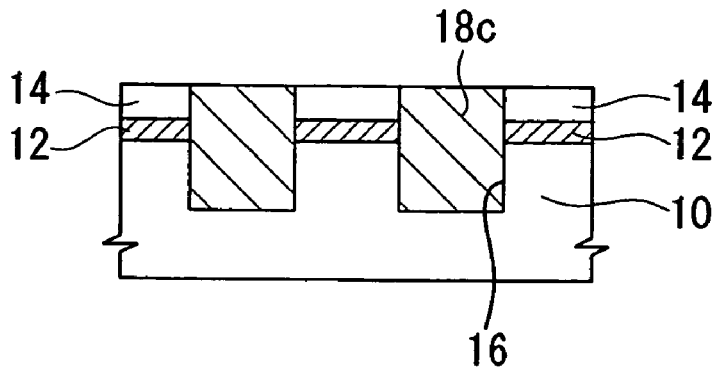
FIG. 3 is a sectional view of process explanatory of the method for planarizing the surface of the common semiconductor device by chemical mechanical polishing (CMP).
Figure 4A:
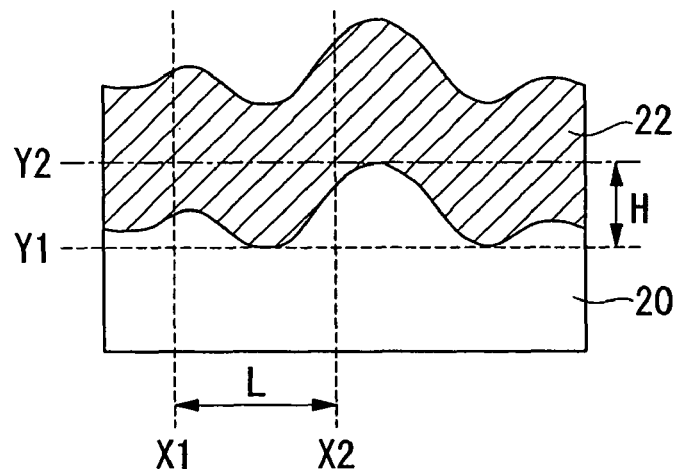
FIG. 4a is a sectional view showing the surface of a semiconductor substrate prior to the CMP process for the explanation of nanotopography.
Figure 4B:
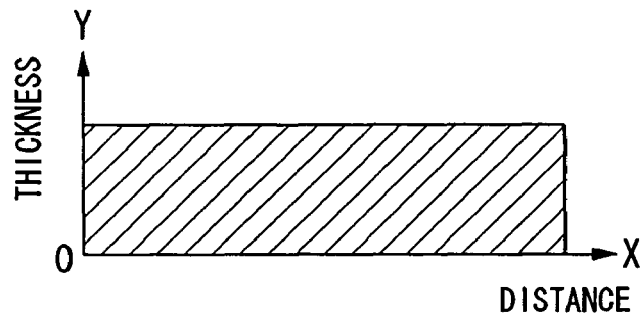
FIG. 4b is a schematic diagram showing the thickness of an oxide film formed on the semiconductor substrate prior to the CMP process.
Figure 5A:
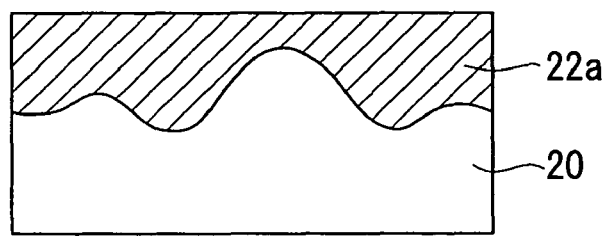
FIG. 5a is a sectional view showing the surface of the semiconductor substrate after the semiconductor substrate of FIG. 4a has been subjected to the CMP process.
Figure 5B:
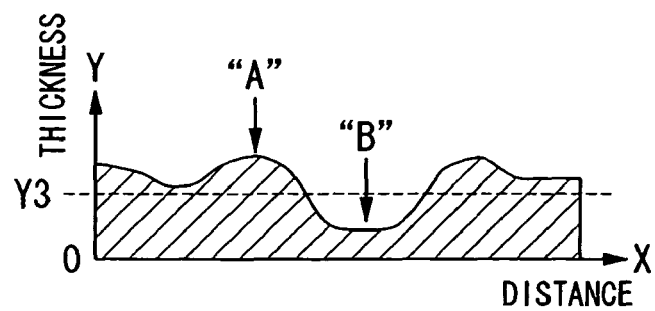
FIG. 5b is a schematic diagram showing the thickness of the oxide film formed on the semiconductor substrate after the CMP process.

For example, while the example dealt with bare wafers without any patterns formed thereon, the present invention can be applied also to the stage of planarizing the surface of a semiconductor substrate having a trench pattern formed thereon as shown in FIG. 3, or to various CMP processes that are carried out when manufacturing semiconductor integrated circuits.

Also the ceria abrasive particles are used in this example, although it goes without saying that various other abrasive particles such as silica-based abrasive particles can be used. While the anionic additive is used in the example, the additive is not limited to this and various types of additive including cationic additive may be used.

While the highest additive concentration in the slurries in this example was 0.8% by weight, it needs not to say that the present invention can be applied also to a slurry that contains the additive in a concentration up to 10% by weight through proper optimization. However, it is not preferable that the additive concentration is 10% by weight or higher, since it leads to significant decrease in rate of removing by polishing. While three types of abrasive particle size distribution were tested, it goes without saying that optimized abrasive particle size distribution in a range from 2 nm to 1000 nm may also be employed. When the abrasive particles are smaller than 2 nm, polishing effect can hardly be achieved and, when the abrasive particles are larger than 1000 nm, the polished surface may have serious scratches.

When the standard deviation of OTD is controlled within a tolerance of 25 Å in this example where depth of polishing the oxide layer is set to 3000 Å, Table 2 shows that use of slurry B containing 0.8% by weight of the additive and slurry C containing 0.6% by weight or 0.8% by weight of the additive lead to undesirable results.

Besides the additive used in this example, various other additives may be used, so as to obtain an optimum slurry composition while varying the conditions of CMP process of this example.

INDUSTRIAL APPLICABILITY

According to the present invention, nanotopography effect of the wafer surface can be effectively compensated for by using the slurry for chemical-mechanical polishing that has the additive with concentration controlled within a predetermined range and the abrasive particle sizes controlled within a predetermined range and were optimized. As a result, an oxide layer of uniform thickness can be obtained after the CMP process, thus improving the reliability of the semiconductor device.

The invention claimed is:

1. A method for planarizing the surface of a semiconductor device, comprising:
    preparing a wafer where nanotopography of certain height and certain wavelength is formed in the surface thereof, and a slurry composition for chemical-mechanical polishing;
    forming an oxide layer of a predetermined thickness on said wafer by vapor deposition; and
    removing said oxide layer so as to planarize the surface and to control a deviation of thickness of said oxide layer below a certain level by chemical mechanical polishing process using said slurry composition,
    wherein said slurry composition includes abrasive particles of ceria, a dispersant, an anionic organic additive, and a pH adjuster, said abrasive particles of ceria are prepared by a solid displacement reaction method, in which a size of said abrasive particles contained in said slurry composition is controlled to be within a range from 2 nm to 1000 nm, a concentration of said anionic organic additive is controlled to be within a range from 0.05% to 0.8% by weight, the pH of said slurry composition is adjusted to approximately 7.0, and in the preparing of said slurry composition, the size of said abrasive particles of ceria and the concentration of said anionic organic additive contained in said slurry composition are controlled within predetermined ranges in order to control the deviation of thickness of said oxide layer below a certain level.

2. The method for planarizing the surface of a semiconductor device according to claim 1, wherein said wafer is a bare wafer in the step of preparing the wafer.

3. The method for planarizing the surface of a semiconductor device according to claim 1, wherein said wafer has a nitride layer formed on the surface and a trench formed therein in the step of preparing the wafer.

* * * * *

UNITED STATES PATENT AND TRADEMARK OFFICE
CERTIFICATE OF CORRECTION

| | | |
|---|---|---|
| PATENT NO. | : 7,833,908 B2 | Page 1 of 1 |
| APPLICATION NO. | : 10/556377 | |
| DATED | : November 16, 2010 | |
| INVENTOR(S) | : Jea Gun Park | |

It is certified that error appears in the above-identified patent and that said Letters Patent is hereby corrected as shown below:

On title page, item (73) Assignee replace "Hanyang Hak Won Co."

with -- Hanyang Hak Won Co., Ltd. --

Signed and Sealed this

Fifteenth Day of February, 2011

David J. Kappos
*Director of the United States Patent and Trademark Office*